United States Patent
Kondo

(10) Patent No.: US 10,094,880 B2
(45) Date of Patent: Oct. 9, 2018

(54) DETERMINING BATTERY STATE OF CHARGE USING AN OPEN CIRCUIT VOLTAGE MEASURED PRIOR TO A DEVICE OPERATION STAGE

(71) Applicant: SEMICONDUCTOR COMPONENTS INDUSTRIES, LLC, Phoenix, AZ (US)

(72) Inventor: Hideo Kondo, Oizumi-Machi (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 316 days.

(21) Appl. No.: 14/685,990

(22) Filed: Apr. 14, 2015

(65) Prior Publication Data

US 2016/0306013 A1 Oct. 20, 2016

(51) Int. Cl.
G01N 27/42 (2006.01)
G01R 31/36 (2006.01)

(52) U.S. Cl.
CPC ........ G01R 31/362 (2013.01); G01R 31/3637 (2013.01)

(58) Field of Classification Search
CPC .......................... G01R 31/362; G01R 31/3637
USPC ....................................... 324/427
See application file for complete search history.

(56) References Cited

U.S. PATENT DOCUMENTS

| | | | |
|---|---|---|---|
| 2005/0069773 | A1 | 3/2005 | Nakai |
| 2007/0024242 | A1* | 2/2007 | Seo ................. G01R 31/362 320/132 |
| 2009/0091299 | A1 | 4/2009 | Lin et al. |
| 2012/0068666 | A1 | 3/2012 | Abe et al. |
| 2012/0105010 | A1 | 5/2012 | Kinoshita |
| 2012/0158330 | A1 | 6/2012 | Araki |
| 2012/0176092 | A1 | 7/2012 | Fujii et al. |
| 2012/0268058 | A1 | 10/2012 | Enoki |
| 2013/0002194 | A1 | 1/2013 | Sasaki et al. |
| 2013/0009605 | A1 | 1/2013 | Hongo et al. |
| 2013/0221927 | A1* | 8/2013 | Lorin ................. G01R 31/36 320/132 |
| 2013/0317771 | A1 | 11/2013 | Laskowsky et al. |
| 2014/0191731 | A1 | 7/2014 | Miura |
| 2014/0210418 | A1 | 7/2014 | Wang et al. |

* cited by examiner

*Primary Examiner* — Nathaniel Pelton
(74) *Attorney, Agent, or Firm* — The Noblitt Group, PLLC

(57) ABSTRACT

A system to accurately determine a battery state of charge (SOC) in an electronic device, in some embodiments, comprises: a battery to provide power to said electronic device; and a fuel gauge coupled to the battery and capable of determining an open circuit voltage (OCV) associated with the battery, wherein the fuel gauge determines said OCV after the battery is installed in the electronic device and before the electronic device enters an operation stage, wherein the fuel gauge determines a state of charge associated with the battery based on said OCV.

19 Claims, 5 Drawing Sheets

DETERMINING BATTERY STATE OF CHARGE USING AN OPEN CIRCUIT VOLTAGE MEASURED PRIOR TO A DEVICE OPERATION STAGE

BACKGROUND

Consumer electronics—such as smart phones, laptops, tablets, video cameras and handheld game consoles—are typically powered by batteries. Most such electronic devices include display screens that provide various types of status information, such as date, time, weather, social media notifications, e-mail notifications and the like. Usually included among such status information is the remaining capacity (or "state of charge") of the device battery, which is often displayed as a percentage of the total capacity of the battery. The battery capacity is determined based at least in part on an open circuit voltage (OCV) measurement of the battery. Current techniques for determining the OCV, however, are suboptimal and produce inaccurate results.

SUMMARY

At least some of the embodiments disclosed herein are directed to a system to accurately determine a battery state of charge (SOC) in an electronic device, comprising: a battery to provide power to said electronic device; and a fuel gauge coupled to the battery and capable of determining an open circuit voltage (OCV) associated with the battery, wherein the fuel gauge determines said OCV after the battery is installed in the electronic device and before the electronic device enters an operation stage, wherein the fuel gauge determines a state of charge associated with the battery based on said OCV. At least some of these embodiments may be supplemented using one or more of the following concepts, in any order and in any combination: wherein, during said operation stage, a load is applied to the battery; wherein the electronic device enters one or more of a no battery stage, a battery insertion stage, a no load stage, and an operation stage; wherein the fuel gauge determines said OCV during the battery insertion stage; wherein the fuel gauge enters a standby stage after determining said OCV and before the electronic device enters the operation stage; wherein the fuel gauge determines said OCV during the no-load stage; wherein the fuel gauge enters a standby stage after determining said OCV and before the electronic device enters the operation stage; wherein a current provided by the battery drops below a target current threshold during the battery insertion stage, the no load stage, or both; wherein the fuel gauge determines the OCV based on a maximum voltage detected from said battery during a predetermined period of time; wherein the fuel gauge determines the OCV based on a voltage detected from said battery after a predetermined period of time is complete.

At least some embodiments are directed to an electronic device, comprising: battery that powers said electronic device; and a fuel gauge, coupled to the battery, that determines an open circuit voltage (OCV) of the battery before said electronic device enters an operation stage, wherein, after said battery is installed in the electronic device, said battery remains installed in the electronic device at least until the electronic device enters the operation stage. At least some of these embodiments may be supplemented using one or more of the following concepts, in any order and in any combination: wherein the fuel gauge determines a state of charge associated with the battery based on said OCV; wherein the fuel gauge determines said state of charge by comparing the OCV to a state of charge curve.

At least some embodiments are directed to a method for determining a battery state of charge in an electronic device, comprising: installing a battery in an electronic device; determining an open circuit voltage (OCV) of the battery while said battery remains installed in said electronic device; after determining said OCV, causing the electronic device to enter an operation stage while said battery remains installed in said electronic device; and determining a state of charge of the battery using said OCV. At least some of these embodiments may be supplemented using one or more of the following concepts, in any order and in any combination: further comprising causing the electronic device to enter a no-load stage while said battery remains installed and after determining said OCV; wherein determining the OCV comprises determining said OCV during a battery insertion stage; further comprising displaying a battery capacity indication based on the state of charge; wherein determining said OCV comprises determining the OCV when no load is coupled to the battery; further comprising causing the fuel gauge to enter a stand by stage after said OCV determination and prior to the electronic device entering said operation stage; further comprising maintaining a current from the battery at or below a target current threshold during a no-load stage of the electronic device.

BRIEF DESCRIPTION OF THE DRAWINGS

There are disclosed in the drawings and in the following description specific systems and methods for determining battery state of charge using an open circuit voltage measured prior to a device operation stage. In the drawings.

Figure 1:
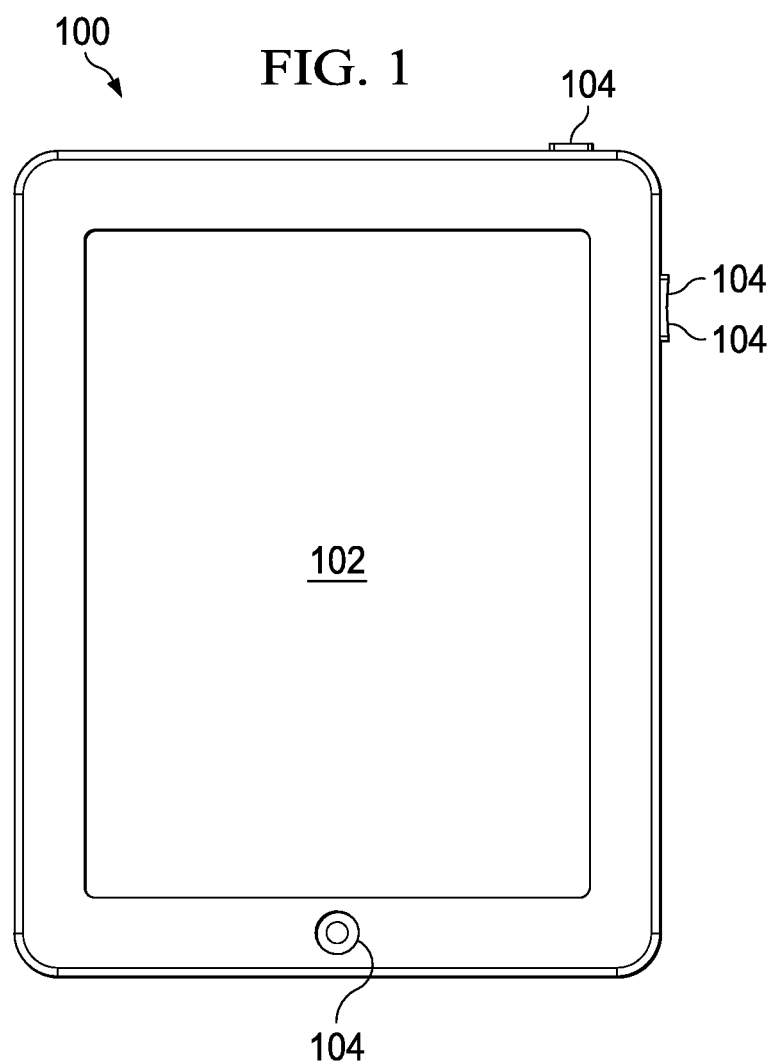
FIG. 1 is a front view of an illustrative electronic device.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

Disclosed herein are methods and systems for determining battery state of charge (SOC) using an open circuit voltage (OCV) measured prior to a device operation stage. An electronic device that operates in accordance with the techniques disclosed herein comprises a fuel gauge that is adapted to couple in parallel to a battery that powers the electronic device. When the battery is installed in the electronic device and before a load (e.g., an ASIC) is coupled to the battery, the fuel gauge measures the OCV of the battery. This OCV measurement is preferably done immediately after the battery is inserted, or, at a minimum, at some point in time prior to the operation stage when a load begins drawing current from the battery. The fuel gauge compares the OCV to an SOC curve to convert the OCV reading to a capacity level (or "state of charge" (SOC)). The state of charge is then used as desired—for example and without limitation, it may be used to display a battery capacity reading on the electronic device display screen.

FIG. 1 is a front view of an illustrative electronic device 100 that implements the techniques described herein. The electronic device 100 may be any suitable device that uses a battery (e.g., a lithium ion battery). Non-limiting examples of such electronic devices include smart phones (e.g., APPLE iPHONE®, SAMSUNG GALAXY NOTE®), tablets (e.g., APPLE iPAD®, AMAZON KINDLE®), laptops, video cameras (including camcorders), and handheld game consoles (e.g., SONY PLAYSTATION VITA®). Other such devices are contemplated and included within the scope of this disclosure. The illustrative consumer electronic device 100 includes a display screen 102 that is preferably a touch screen. It further includes various tactile input devices 104, such as buttons arranged in various locations around the exterior of the electronic device 100. Additional input and output devices, such as microphones and speakers, also may be incorporated within such a device.

Figure 2:
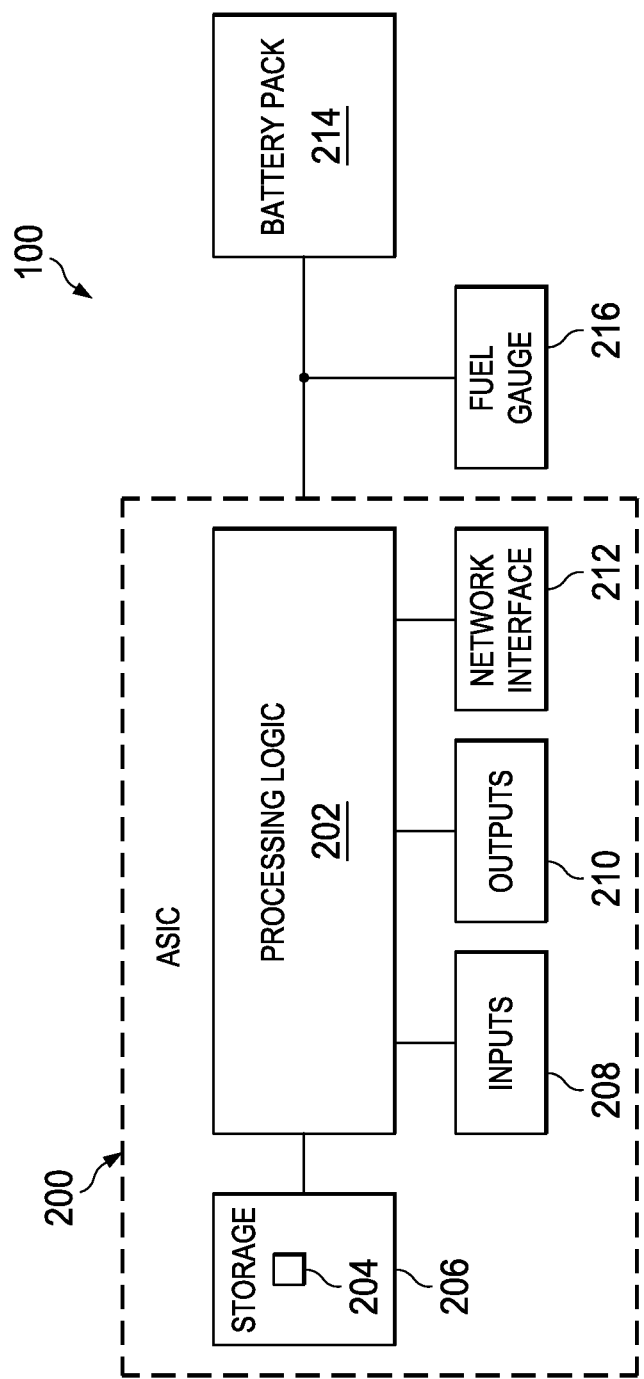
FIG. 2 is a block diagram of at least some components within an electronic device.

FIG. 2 is a block diagram of components within the illustrative consumer electronic device 100. The electronic device 100 includes an application-specific integrated circuit (ASIC) 200 comprising processing logic 202 (e.g., a microprocessor), storage 206 coupled to the processing logic 202 and comprising software code 204 (e.g., an operating system or applications), input features 208 (e.g., buttons, touch screen, microphone), output features 210 (e.g., display screen that may be the same as the touch screen, speaker, haptic feedback motor), and a network interface 212 for communicating with other devices (e.g., via the Internet). Other components may be included on the ASIC 200. The ASIC 200 is powered by a battery pack ("battery") 214. A fuel gauge 216 couples to the battery 214. In at least some embodiments, the ASIC 200, the fuel gauge 216 and the battery 214 couple to each other in a parallel configuration, so that the ASIC 200 may receive power from the battery 214 while the fuel gauge 216 monitors the output of the battery 214. Further, in some embodiments the ASIC 200 may be replaced by a plurality of ASICs or other circuitry. The techniques disclosed herein may be implemented in any electronic device in which any suitable type of load (here, the ASIC 200) is powered by the battery 214. In operation, and as described in greater detail with respect to FIG. 3, the fuel gauge 216 determines the OCV of the battery 214 immediately after the battery 214 is installed in the electronic device 100, or at least before a load is applied to the battery 214. In this way, an accurate OCV reading is obtained and is used to accurately determine the battery SOC.

Figure 3:
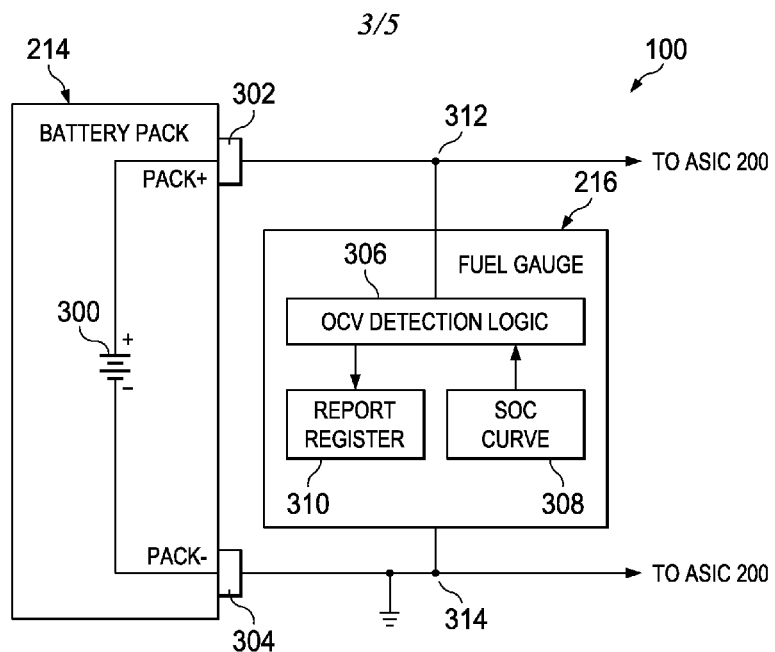
FIG. 3 is a block diagram of at least some components within a fuel gauge of an electronic device.

FIG. 3 is a block diagram of components within the consumer electronic device 100 and, more particularly, within the fuel gauge 216. The block diagram of FIG. 3 is conceptual in nature, meaning that at least some of the blocks represent functions performed by the various parts of the electronic device 100. The actual circuit logic used to implement the functions represented by the blocks may vary depending on design considerations and preferences and will be readily known to or determined by one of ordinary skill in the art.

Referring to FIG. 3, the battery 214 contains a voltage source 300 that provides a potential across terminals 302, 304. Terminal 304 couples to ground and node 314, which, in turn, couples to the fuel gauge 216 and ASIC 200. Terminal 302 couples to node 312, which, in turn, couples to the fuel gauge 216 and the ASIC 200. The fuel gauge 216 includes OCV detection logic 306, a state of charge curve 308 (e.g., data describing the relationship between OCV values and battery capacity/state of charge values), and a report register 310. In operation, the battery 214 is installed in the electronic device 100, but the battery 214 is not coupled to a load (e.g., ASIC 200). Thus, at this time, the battery is in an "open circuit" state. Accordingly, the fuel gauge 216 (and, more specifically, the OCV detection logic 306), which is coupled to the battery 214, determines the voltage being output by the battery 214. Because the battery 214 is not presently coupled to a load, this voltage is the OCV. The OCV detection logic 306 preferably determines the OCV immediately after the battery 214 is installed in the electronic device 100. In at least some embodiments, the OCV detection logic 306 determines the OCV during a battery installation stage, and in at least some embodiments, the OCV detection logic 306 determines the OCV during a no-load or no-operation stage. These stages are described in greater detail with regard to FIG. 5 below. At a minimum, however, the OCV detection logic 306 determines the OCV prior to an operation stage in which the load (e.g., ASIC 200) is applied to the battery 214 and current is drawn from the battery 214. After the OCV detection logic 306 determines the OCV, the OCV detection logic 306 compares the OCV reading to the SOC curve 308 to determine the battery capacity/SOC value.

Figure 4:
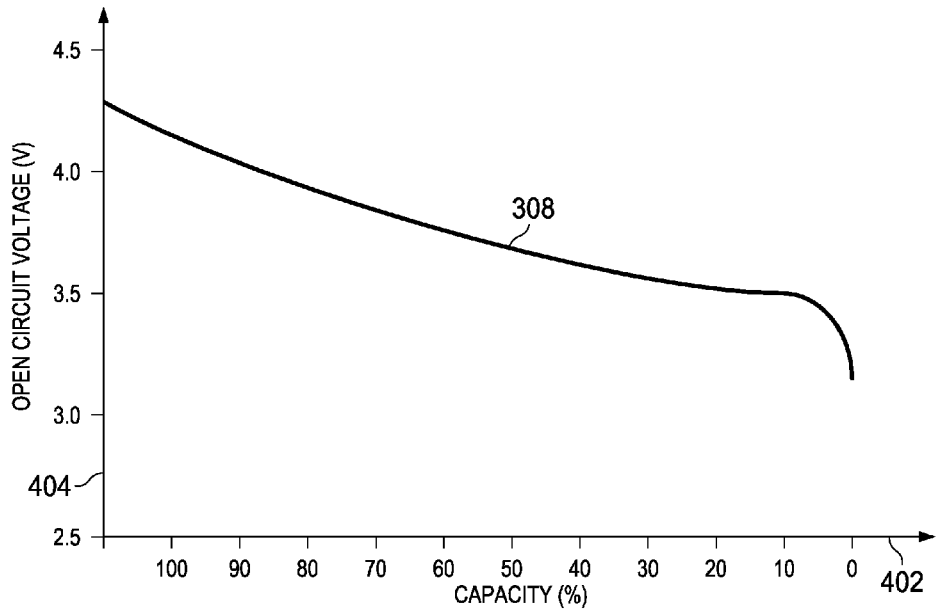
FIG. 4 is a state of charge curve usable to translate open circuit voltage measurements to state of charge values.

FIG. 4 shows an illustrative SOC curve 308. The curve 308 is plotted on an x-axis 402 that includes SOC, or capacity, expressed as a percentage of total battery capacity, and on a y-axis 404 that includes OCV expressed in Volts. The OCV detection logic 306, after determining the OCV, compares the OCV reading to the curve 308 to find a corresponding SOC value. The OCV detection logic 306 stores the SOC value in the report register 310 (FIG. 3), from which the SOC value may later be read and used as desired and suitable. The curve 308 is merely illustrative and does not limit the scope of the disclosure. The curve 308 may vary based on various factors—for example, the specific type, manufacturer and model of the electronic device 100 or battery 214 being used.

Figure 5:
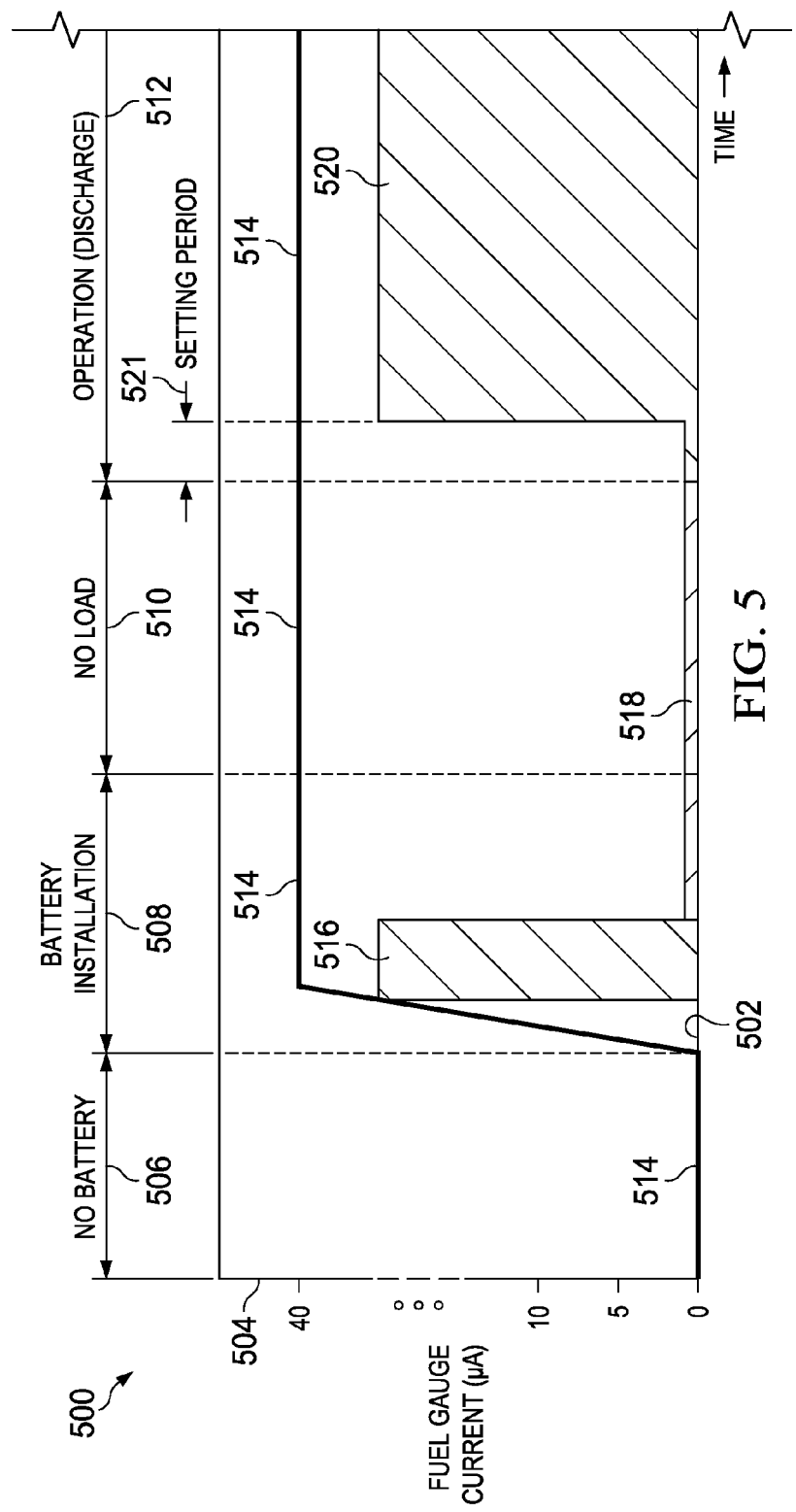
FIG. 5 is a timing diagram describing various actions that occur during different electronic device stages.

FIG. 5 is a timing diagram 500 describing various actions that occur during different electronic device 100 stages. More particularly, the timing diagram 500 describes four stages: a no battery stage 506, during which the battery 214 has not yet been installed in the electronic device 100; a battery installation stage 508, during which the battery 214 is being installed in the electronic device 100; a no-load stage 510, during which the battery 214 is installed in the electronic device 100 but is not yet coupled to a load; and an operation stage 512, during which a load is applied to and draws current from the battery 214. The x-axis 502 denotes time, and the y-axis 504 denotes fuel gauge current expressed in micro-Amperes. During the no battery stage 506, the fuel gauge 216 is inactive, as numeral 514 shows. During the battery installation stage 508, the battery 214 is being installed Immediately after the battery 214 is installed and the fuel gauge 216 draws enough current to determine the OCV at the battery terminals, the fuel gauge 216 measures the OCV, as numeral 516 indicates. At approximately this time, the fuel gauge drawn current reaches steady state, as numeral 514 indicates. After the fuel gauge 216 determines the OCV and stores a corresponding SOC value in the report register 310 (FIG. 3), the fuel gauge 216 enters a standby mode to conserve power, as numeral 518 indicates. The fuel gauge 216 remains in standby mode during the balance of the battery installation stage 508 and the entirety of the no-load stage 510, until the operation stage 512 begins and the load begins drawing current from the battery 214. In some embodiments, when the operation stage 512 begins, the ASIC 200 initializes the fuel gauge 216 by setting one or more registers in the fuel gauge 216 and completing any other necessary, preliminary activities. This setting period typically lasts approximately 10 milliseconds, at which time the fuel gauge 216 begins operation. An illustrative setting period is indicated in FIG. 5 by numeral 521.

The timing diagram 500 is non-limiting, and variations on the timing of the various actions described in the diagram 500 are contemplated and included within the scope of the disclosure. For example and without limitation, the fuel gauge may determine the OCV by monitoring the battery voltage for a predetermined period of time (e.g., a period of several milliseconds during the battery installation stage 508), identifying the maximum voltage detected during that predetermined period of time, and equating the OCV to that maximum detected voltage. The predetermined period of time may be programmed using, e.g., a register in the fuel gauge (not specifically shown). Similarly, the fuel gauge may determine the OCV only after a predetermined period of time has elapsed (e.g., a period of several milliseconds during the battery installation stage 508), and in some embodiments, the fuel gauge may determine the OCV immediately after such predetermined period of time has elapsed. This predetermined period of time may be programmed using, e.g., a register in the fuel gauge (not specifically shown). Furthermore, although the diagram 500 shows the OCV being determined during the battery installation stage 508 (numeral 516), in some embodiments, the fuel gauge determines the OCV during the no-load stage 510, or in between the battery installation stage 508 and the no-load stage 510. In yet other embodiments, the OCV is determined in any stage so long as no load (other than the fuel gauge) has been coupled to the battery. Regardless of when the OCV is determined, the fuel gauge may be in a standby mode before the OCV determination, after the OCV determination, or both. The battery, once installed in the electronic device, remains installed in the electronic device throughout the battery installation stage 508, the no-load stage 510, and some or all of the operation stage 512. In addition, during the battery installation stage 508, no-load stage 510, or both, the current provided by the battery 214 drops below a target current threshold (e.g., 60 microAmperes). This desirably low current draw occurs at least in part due to the fact that no load is coupled to the battery 214 during these stages, and also due to the fact that the fuel gauge is in a standby mode for at least part of the time during these stages.

Figure 6:
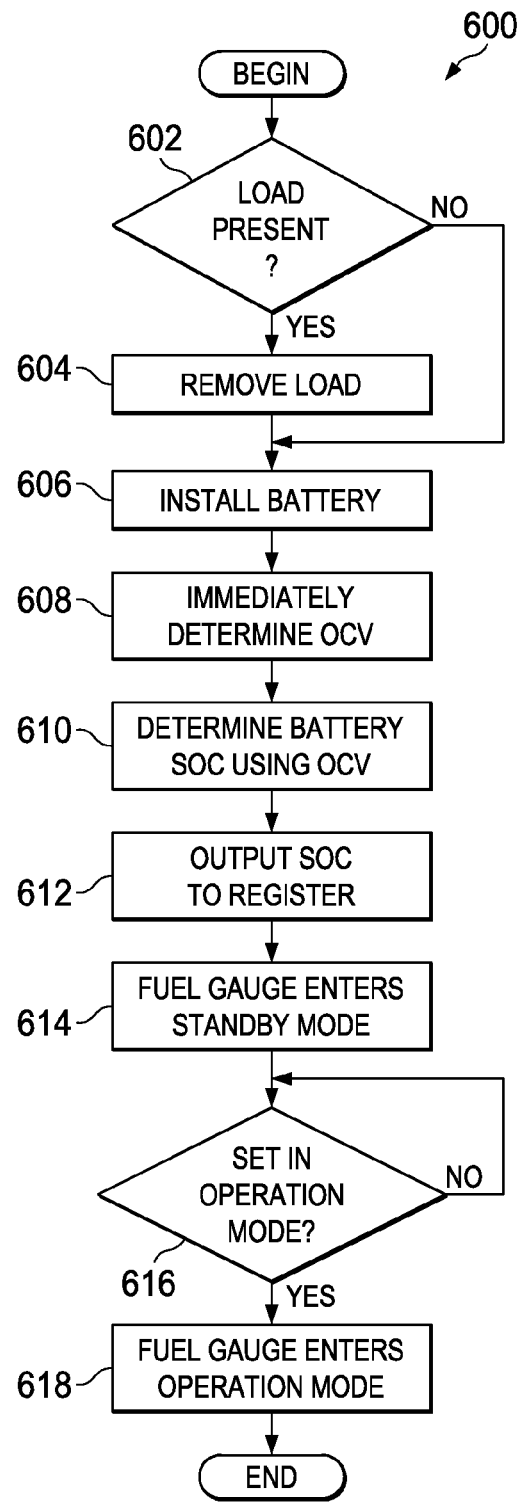
FIG. 6 is a flow diagram of a method usable to implement the techniques disclosed herein.

FIG. 6 is a flow diagram of a method 600 usable to implement the techniques disclosed herein. The method 600 begins by determining whether a load is present in the electronic device (step 602). If so, the load is removed (step 604). The method 600 continues by installing the battery in the electronic device (step 606) and immediately determining the OCV (step 608). As explained above, in some embodiments, the fuel gauge determines the OCV during the battery installation stage; in other embodiments, the fuel gauge determines the OCV during the no-load stage; and in some embodiments, the fuel gauge determines the OCV during both of these stages. In any case, however, the fuel gauge determines the OCV before the operation stage 512— that is, before a load is coupled to and begins drawing current from the battery.

The method 600 then continues by determining the battery state of charge using the OCV (step 610). The fuel gauge outputs the state of charge value to a register or some other appropriate storage for later use (step 612). The fuel gauge then enters a standby mode (step 614) until a load is coupled to the battery and the electronic device begins operation as a set (step 616). At that time, the method 600 includes the fuel gauge exiting the standby mode and entering an operation mode (step 618). The method 600 is illustrative, and steps of the method may be modified, added, deleted, or rearranged, as desired.

Numerous other variations and modifications will become apparent to those skilled in the art once the above disclosure is fully appreciated. It is intended that the following claims be interpreted to embrace all such variations, modifications and equivalents. In addition, the term "or" should be interpreted in an inclusive sense.

What is claimed is:

1. A system to accurately determine a battery state of charge (SOC) in an electronic device, comprising:
    a fuel gauge configured to determine an open circuit voltage (OCV) associated with a battery,
    wherein the fuel gauge determines said OCV after the battery is installed in the electronic device and before the electronic device enters an operation stage,
    wherein the fuel gauge determines a state of charge associated with the battery based on said OCV,
    wherein the fuel gauge enters a standby mode after determining said OCV and before the electronic device enters the operation stage,
    wherein the fuel gauge enters an operation mode from the standby mode when the electronic device enters the operation stage, and
    wherein the fuel gauge consumes less power during the standby mode than is consumed prior to entering the standby mode and less power than is consumed after entering the operation mode.

2. The system of claim 1, wherein, during said operation stage, a load is applied to the battery.

3. The system of claim 1, wherein the electronic device enters one or more of a no battery stage, a battery insertion stage, a no load stage, and an operation stage.

4. The system of claim 3, wherein the fuel gauge determines said OCV during the battery insertion stage.

5. The system of claim 3, wherein the fuel gauge determines said OCV during the no-load stage.

6. The system of claim 5, wherein the fuel gauge enters a standby stage after determining said OCV and before the electronic device enters the operation stage.

7. The system of claim 3, wherein a current provided by the battery drops below a target current threshold during the battery insertion stage, the no load stage, or both.

8. The system of claim 1, wherein the fuel gauge determines the OCV based on a maximum voltage detected from said battery during a predetermined period of time.

9. The system of claim 1, wherein the fuel gauge determines the OCV based on a voltage detected from said battery after a predetermined period of time is complete.

10. An electronic device, comprising:
    a fuel gauge configured to determine an open circuit voltage (OCV) of a battery before said electronic device enters an operation stage,
    wherein, after said battery is installed in the electronic device, said battery remains installed in the electronic device at least until the electronic device enters the operation stage, wherein the fuel gauge enters a standby mode after determining said OCV and before the electronic device enters the operation stage, wherein the fuel gauge enters an operation mode from the standby mode when the electronic device enters the operation stage, and wherein the fuel gauge consumes less power during the standby mode than is consumed prior to entering the standby mode and less power than is consumed after entering the operation mode.

11. The electronic device of claim 10, wherein the fuel gauge determines a state of charge associated with the battery based on said OCV.

12. The electronic device of claim 11, wherein the fuel gauge determines said state of charge by comparing the OCV to a state of charge curve.

13. A method for determining a battery state of charge in an electronic device, comprising:
- determining an open circuit voltage (OCV) of a battery installed in the electronic device while said battery remains installed in said electronic device;
- after determining said OCV, causing the electronic device to enter an operation stage while said battery remains installed in said electronic device; and
- determining a state of charge of the battery using said OCV,
- wherein the determining the OCV of the battery is performed by a fuel gauge that enters a standby stage after determining said OCV and before the electronic device enters the operation stage,
- wherein the fuel gauge enters an operation mode from the standby mode when the electronic device enters the operation stage, and
- wherein the fuel gauge consumes less power during the standby stage than is consumed prior to entering the standby stage and less power than is consumed after entering the operation mode.

14. The method of claim 13, further comprising causing the electronic device to enter a no-load stage while said battery remains installed and after determining said OCV.

15. The method of claim 13, wherein determining the OCV comprises determining said OCV during a battery insertion stage.

16. The method of claim 13, further comprising displaying a battery capacity indication based on the state of charge.

17. The method of claim 13, wherein determining said OCV comprises determining the OCV when no load is coupled to the battery.

18. The method of claim 13, further comprising maintaining a current from the battery at or below a target current threshold during a no-load stage of the electronic device.

19. The method of claim 18, further comprising maintaining the current from the battery at a non-zero amount no greater than 60 micro-Amperes during the no-load stage of the electronic device.

* * * * *